United States Patent
Genicola et al.

(10) Patent No.: US 7,335,969 B2
(45) Date of Patent: Feb. 26, 2008

(54) METHOD OF MONITORING INTRODUCTION OF INTERFACIAL SPECIES

(75) Inventors: Lance Genicola, Whitehall, PA (US); Mark J. Hurley, Poughkeepsie, NY (US); Jeremy J. Kempisty, Beacon, NY (US); Paul D. Kirsch, Fishkill, NY (US); Ravikumar Ramachandran, Pleasantville, NY (US); Suri Hedge, Hollowville, NY (US)

(73) Assignee: International Business Machines Corporation, Armonk, NY (US)

( * ) Notice: Subject to any disclaimer, the term of this patent is extended or adjusted under 35 U.S.C. 154(b) by 519 days.

(21) Appl. No.: 11/076,371

(22) Filed: Mar. 9, 2005

(65) Prior Publication Data

US 2005/0153467 A1    Jul. 14, 2005

(51) Int. Cl.
*H01L 21/66* (2006.01)
(52) U.S. Cl. .............................. 257/629; 257/E21.521; 257/E21.522; 257/E21.529; 257/E21.53; 29/25.01; 438/14; 438/15; 438/17; 438/18
(58) Field of Classification Search ........ 257/E21.625, 257/E21.639, E21.521, E21.522, E21.529, 257/E21.53, 629, 632; 29/25.01; 438/14, 438/15, 16, 17, 18

See application file for complete search history.

(56) References Cited

U.S. PATENT DOCUMENTS

| | | | |
|---|---|---|---|
| 5,216,362 A | 6/1993 | Verkuil | |
| 5,521,525 A | 5/1996 | Nicollian et al. | |
| 6,037,797 A | 3/2000 | Lagowski et al. | |
| 6,249,117 B1 | 6/2001 | Koelsch et al. | |
| 6,391,668 B1 | 5/2002 | Chacon et al. | |
| 6,551,946 B1 | 4/2003 | Chen et al. | |
| 6,617,207 B1 | 9/2003 | Kiryu et al. | |
| 6,699,436 B1 | 3/2004 | Garcia et al. | |
| 2002/0076497 A1 | 6/2002 | Ying et al. | |
| 2003/0109146 A1 | 6/2003 | Colombo et al. | |
| 2003/0119337 A1 | 6/2003 | Chen et al. | |

*Primary Examiner*—George R. Fourson
*Assistant Examiner*—Joannie Adelle García
(74) *Attorney, Agent, or Firm*—Schmeiser, Olsen & Watts; Steven Capella

(57) ABSTRACT

A method for monitoring a nitridation process, including: (a) providing a semiconductor substrate; (b) forming a first dielectric layer on a top surface of the substrate; (c) introducing a quantity of interfacial species into the substrate; (d) removing the first dielectric layer; (e) forming a second dielectric layer on the top surface of the substrate; (f) measuring the density of interface traps between the substrate and the second dielectric layer; (g) providing a predetermined relationship between the quantity of the interfacial species and the density of the interface traps; and (h) determining the quantity of the interfacial species introduced based on the relationship.

14 Claims, 5 Drawing Sheets

METHOD OF MONITORING INTRODUCTION OF INTERFACIAL SPECIES

BACKGROUND OF INVENTION

The present invention relates to the field of semiconductor processing; more specifically, it relates to a method and a system for monitoring an interfacial ion concentration using a corona discharge density of interface traps measurement.

Introduction of interfacial species (atoms, molecules or ions introduced into thin dielectrics near the dielectric/silicon interface) has become a standard technique used in semiconductor manufacturing. Generally, these techniques are performed very early in the fabrication sequence and involve very low concentrations of introduced interface species. Often the tool introducing the interface species cannot be relied upon to give an accurate indication of the amount of species introduced. Therefore an accurate, real time process control is needed in order to take timely corrective action to maximize the amount of product that is processed within specification.

SUMMARY OF INVENTION

A first aspect of the present invention is a method for monitoring a nitridation process, comprising: (a) providing a semiconductor substrate; (b) forming a dielectric layer on a top surface of the substrate; (c) introducing a quantity of interfacial species into the substrate; (d) measuring the density of interface traps between the substrate and the dielectric layer; (e) providing a predetermined relationship between the quantity of the interfacial species and the density of the interface traps; and (f) determining the quantity of the interfacial species introduced based on the relationship.

A second aspect of the present invention is a method for monitoring a nitridation process, comprising: (a) providing a semiconductor substrate; (b) forming a first dielectric layer on a top surface of the substrate; (c) introducing a quantity of interfacial species into the substrate; (d) removing the first dielectric layer; (e) forming a second dielectric layer on the top surface of the substrate; (f) measuring the density of interface traps between the substrate and the second dielectric layer; (g) providing a predetermined relationship between the quantity of the interfacial species and the density of the interface traps; and (h) determining the quantity of the interfacial species introduced based on the relationship.

A third aspect of the present invention is a system for monitoring a process for the introduction of interfacial species between a dielectric layer and a semiconductor substrate comprising: a first station for forming the dielectric layer on a top surface of the substrate; a second station for introducing a quantity of interfacial species into the substrate; a third station for measuring the density of interface traps in the substrate by corona discharge and for determining the quantity of the interfacial species introduced based on a predetermined relationship between the quantity of the interfacial species and the density of interface traps; and means for transferring the substrate between the stations.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

FIGS. 1A through 1F are partial cross-sectional views of a wafer process for introducing and measuring interfacial species concentrations according to the present invention. The wafer process described in FIGS. 1A through 1F is for monitoring nitrogen introduced at a gate dielectric/silicon interface during the fabrication of a complimentary metal-oxide-silicon (CMOS) field effect transistor (FET). It is meant to be exemplary of the present invention and the present invention is not limited to the particular use of monitoring nitrogen at a gate dielectric/silicon interface but may be used to monitor nitrogen at any dielectric/silicon interface. Nitrogen incorporation into the gate dielectric/silicon interface of FETs has the very useful effect of decreasing the equivalent oxide thickness (EOT) of the gate dielectric increasing FET performance.

Figure 1A:
FIGS. 1A through 1F are partial cross-sectional views of a wafer process for introducing and measuring interfacial species concentrations according to the present invention.

In FIG. 1A, a semiconductor substrate 100 is provided. Substrate 100 may be a bulk silicon substrate, a bulk silicon substrate having a silicon epitaxial layer thereon or a silicon-on-insulator (SOI) substrate. In one example, substrate 100 is a lightly P-doped silicon wafer or epitaxial layer. Substrate 100 is cleaned using any number of well-known silicon surface cleaning techniques known in the art. For example, substrate 100 may be cleaned using a Huang A/B wet cleaning process.

Figure 1D:
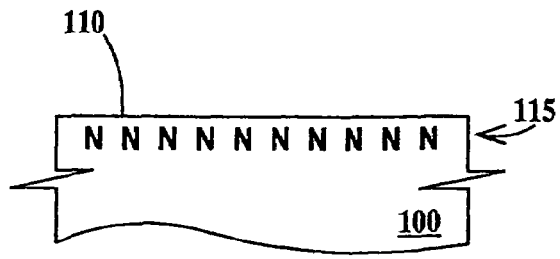
Figure 1B:
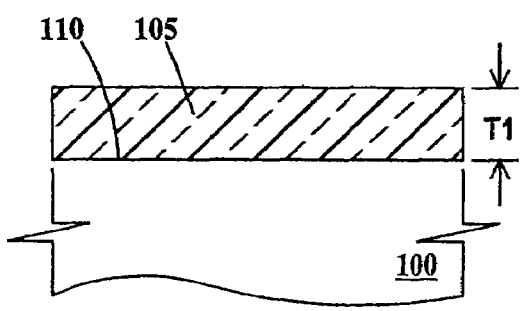

In FIG. 1B a first dielectric layer 105 having a thickness T1 is formed on a top surface 110 of substrate 100. In the present example, dielectric layer 105 is silicon oxide ($SiO_2$) formed by a rapid thermal oxidation (RTO) process and T1 is about 50 to 100. The purpose of dielectric layer 105 is to provide an amorphous screen dielectric (in the present example $SiO_2$) to prevent channeling of the implanted species through the crystal planes of substrate 100 during introduction of interfacial species as describe infra. In the present example, first dielectric layer 105 may be considered a sacrificial layer.

Figure 1E:
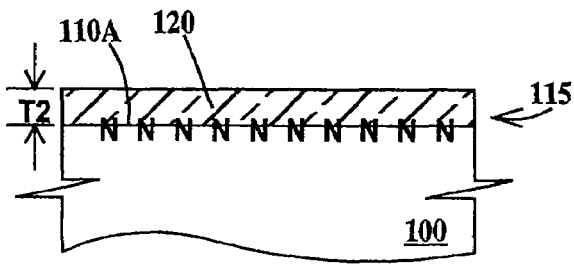
Figure 1C:
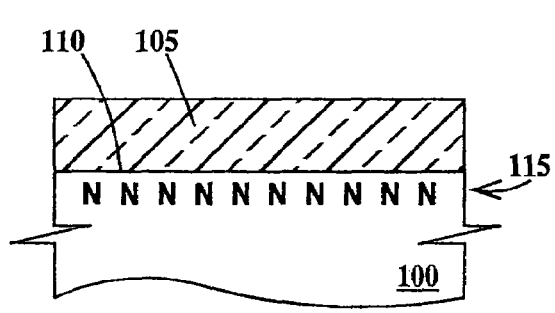

In FIG. 1C, an interfacial species 115 is introduced into substrate 100. In the present example, interfacial species 115 is nitrogen introduced by ion implantation of $N_2^+$. In other examples, interfacial species 115 (as nitrogen) is introduced by a rapid thermal ammonia ($RTNH_3$) process (rapid heating in an ammonia containing atmosphere), by a rapid thermal nitric oxide (RTNO) or rapid thermal nitrous oxide (RTN2O) process (rapid heating in nitric oxide or nitrous oxide containing atmosphere) or by a nitrogen (N*) plasma process. When $RTNH_3$, RTNO, $RTNO_2$ or N* plasma processes are used, first dielectric layer 110 may be the gate dielectric layer and the steps illustrated in FIGS. 1D and 1E and described infra may be skipped if so desired.

In FIG. 1D, first dielectric layer 105 (see FIG. 1C) is removed. In the present example of first dielectric layer 105 being $SiO_2$, the first dielectric layer may be removed using a wet etch containing HF.

In FIG. 1E, a second dielectric layer 120 having a thickness T2 is formed a new top surface 110A (which also defines a $SiO_2$/Si interface) of substrate 100. Top surface 110A is "new" because some silicon is consumed by the oxidation process. In the present example, second dielectric layer 120 is $SiO_2$ formed by a dry oxidation in a furnace or rapid thermal processing (RTP) chamber. In one example, T2 is about 12 to 60 Å. In the present example, second dielectric layer 120 may be considered a gate dielectric layer. During formation of second dielectric layer 120, the interfacial species 115 migrates to the $SiO_2$/Si interface 110A and forms $SiO_xN_y$. It is believed that nitrogen migration to the $SiO_2$/Si interface reduces the free energy of the system by easing interfacial stress. In other examples, second dielectric layer 120 may be a high dielectric constant material such as $Al_2O_3$ or $HfO_2$.

Figure 1F:
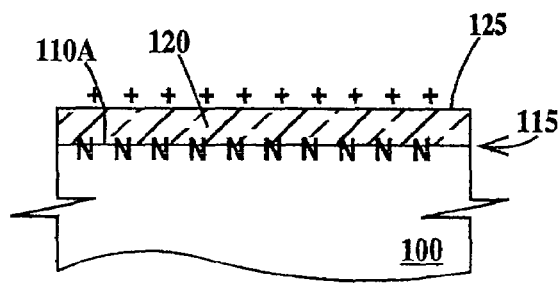

In FIG. 1F, substrate 100 is subjected to a corona discharge in the presence of $H_2O$ and/or $CO_2$ causing ions derived from $H_2O$ and/or $CO_2$ to be deposited on a top surface 125 of the substrate (as indicated by the + symbols) mirroring interface charge. The amount of charge mirrored is a function of the density of interface traps (DIT) at the $SiO_2$/Si interface. Since the DIT is affected by the presence of nitrogen, the DIT measurement serves as a method for monitoring the amount of nitrogen (or other species) introduced in FIG. 1C. For an introduction of nitrogen by ion implantation, the dose $N_2^+$ ions/cm2 can be related to the DIT measured as illustrated in FIG. 3 and described infra.

Substrate 100 may be a monitor substrate or a product substrate, in which case the DIT is performed on a test site or a kerf test structure.

Figure 2:
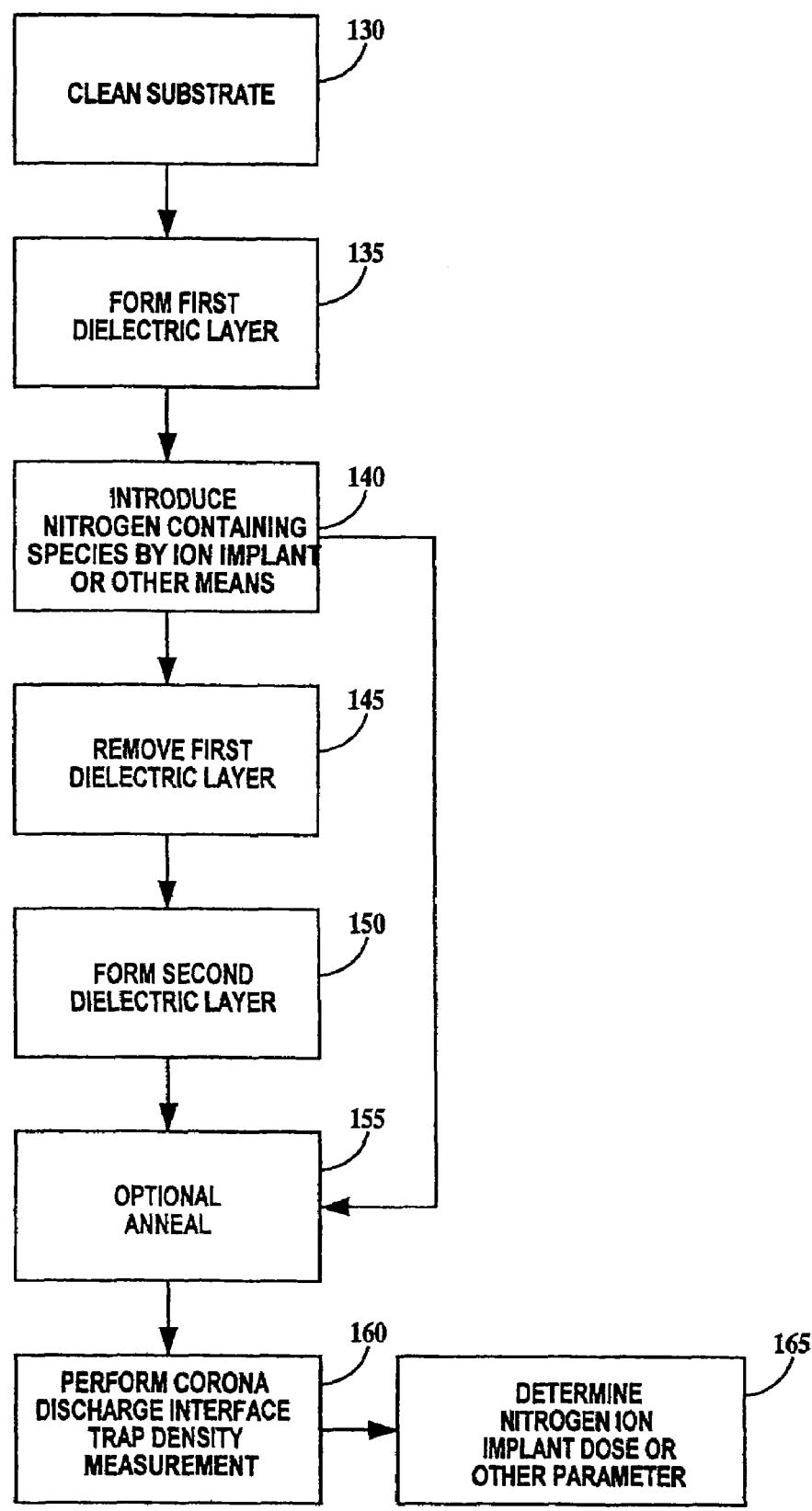
FIG. 2 is a flowchart of a method for introducing and monitoring interfacial species in a substrate according to the present invention.

FIG. 2 is a flowchart of a method for introducing and monitoring interfacial species in a substrate according to the present invention. In step 130, a substrate is cleaned and in step 135, a first dielectric layer (which may be either a sacrificial layer or a gate dielectric layer) is formed on the substrate. In step 140, a nitrogen containing species is introduced into the substrate as described supra in reference to FIG. 1C. If the nitrogen species is introduced by $RTNH_3$, RTNO, $RTNO_2$ or N* plasma, then the method may optionally skip to step 155 (thermal processes such as $RTNH_3$, RTNO, $RTNO_2$ or N* plasma process generally place nitrogen near the dielectric/Si interface, however for dielectric films greater than 20 Å thick, N* processes place significant nitrogen at the top surface of the dielectric layer, although enough nitrogen reaches the dielectric/Si interface to yield a DIT response) and if the nitrogen species is introduced by ion implantation the method proceeds to step 145, since ion implantation damages the first dielectric layer, making the first dielectric layer unsuitable for use as a gate dielectric. In step 145, the first dielectric layer is removed and in step 150 a second dielectric (which may be a gate dielectric layer) is formed. Next in step 155, an optional anneal process may be performed, for example by heating in forming gas (a nitrogen/hydrogen mixture). In step 160 a corona discharge DIT measurement is performed and in step 165, the $N_2^+$ dose is determined from a graph of DIT versus dose, from a lookup table of DIT values versus $N_2^+$ implant dose, or by direct calculation using an equation of a DIT versus $N_2^+$ dose as derived from curve fitting DIT measurements to faraday cup dose measurements. A faraday cup measurement is provided by the ion implant tool itself. The relationship between DIT measurement and dose must be predetermined as illustrated in FIG. 3 and is described infra. In the case of $RTNH_3$, RTNO, $RTNO_2$ and N* plasma, the relationship between DIT measurement and time, temperature or flow may be predetermined.

Figure 3:
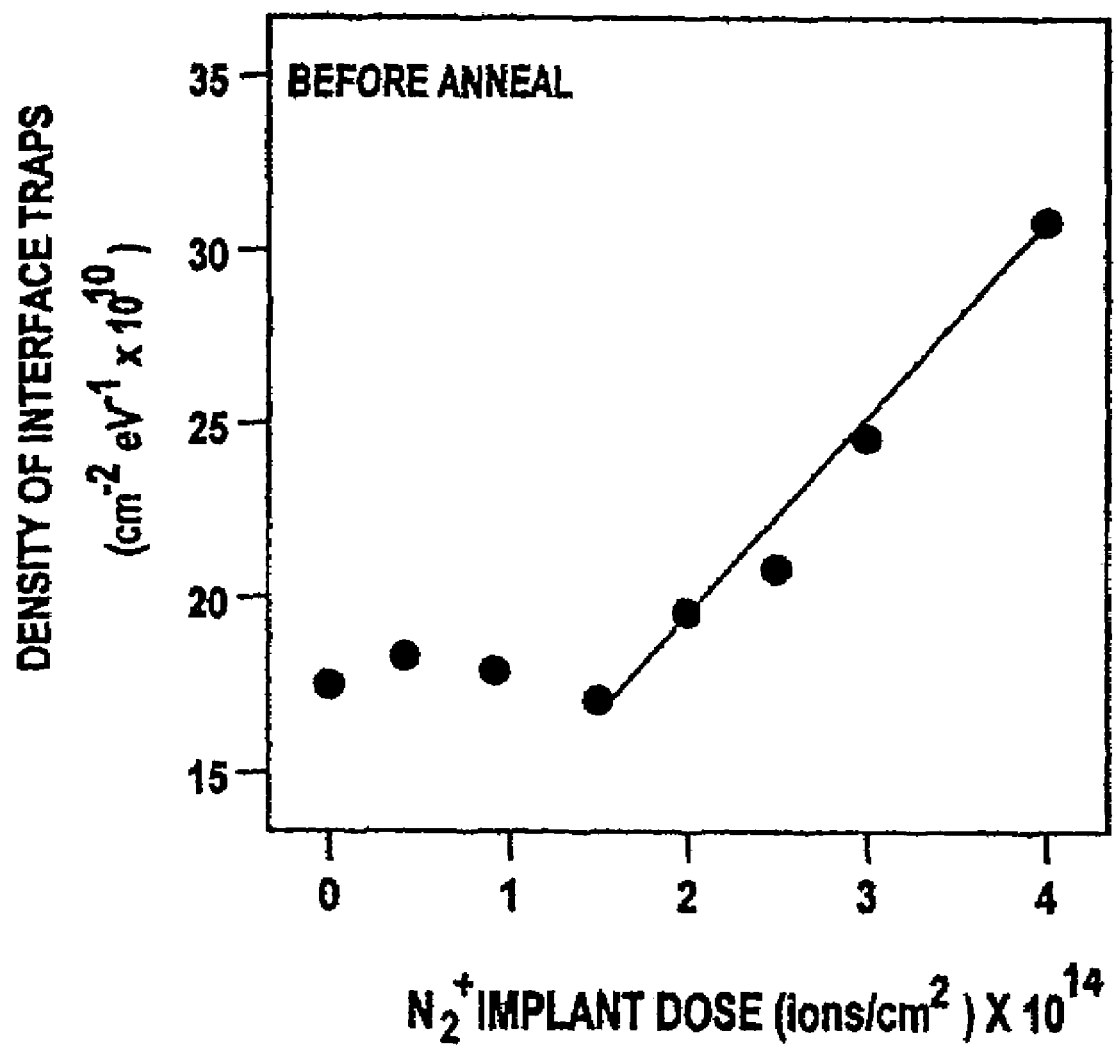
FIG. 3 is a chart illustrating the relationship between the density of interface traps and $N_2^+$ ion implantation does according to one application of the present invention.

FIG. 3 is a chart illustrating the relationship between the density of interface traps and $N_2^+$ ion implantation dose according to one application of the present invention. FIG. 3 plots experimentally determined data points. $N_2^+$ was implanted through 75 Å of sacrificial oxide at about 14 Kev into a P silicon substrate at doses ranging from 0 to $4 \times 10^{14}$ ion/cm$^2$. The sacrificial oxide was removed and 38 Å of gate oxide was grown. No anneal was performed. The implant dose (based on Faraday cup measurements in the ion implant tool) is plotted versus the density of interface traps measured as in step 160 of FIG. 2. As can be seen, the plot is linear in the range of just over $1 \times 10^{14}$ ions/cm$^2$ to $4 \times 10^{14}$ ions/cm having an equation of DIT=$4.67 \times 10^{-4} \times$Dose+$1.01 \times 10^{11}$ with a root mean square fit ($R^2$) of 0.976. Thus from a given DIT measurement, the $N_2^+$ ion implant dose can be determined.

The slope of the DIT versus dose curve will change based on the sacrificial and gate oxide thicknesses and the y-intercept will change based on the amount of anneal performed.

Figure 4:
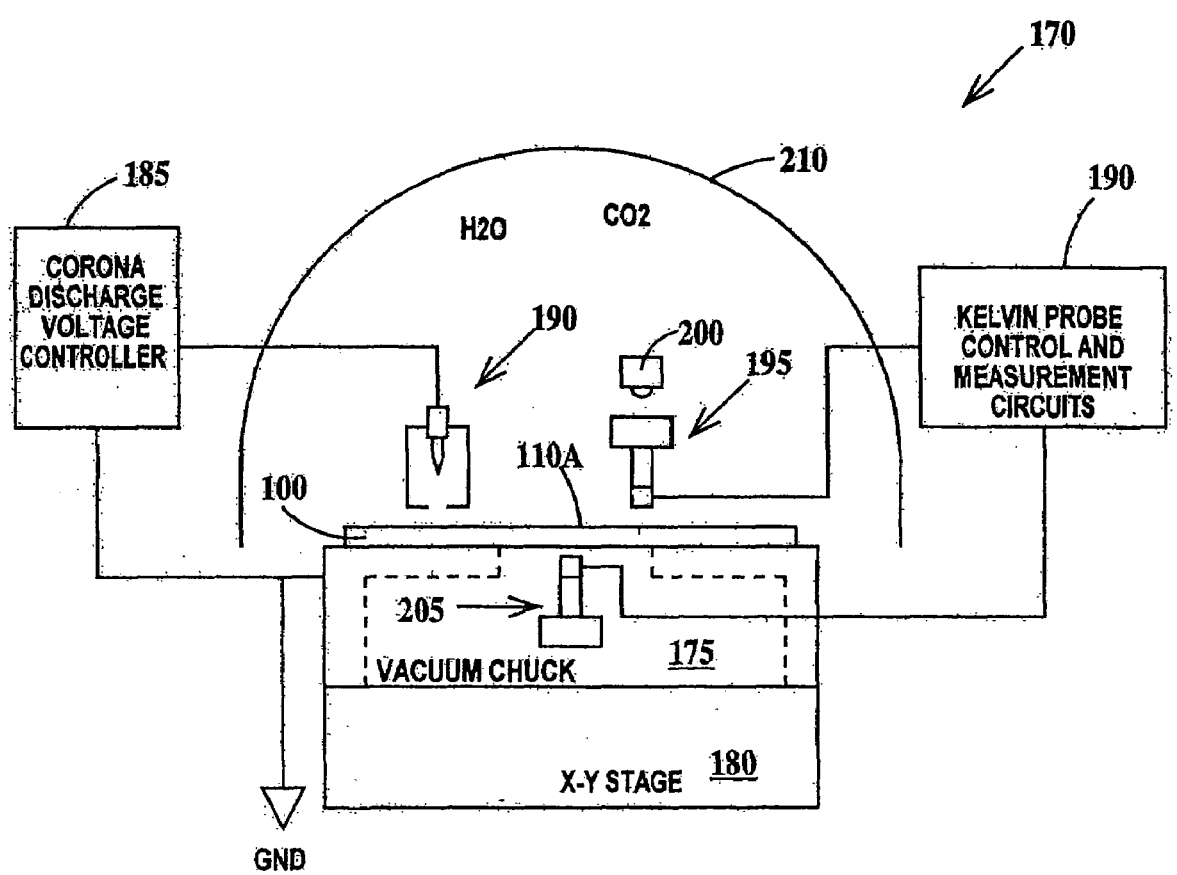
FIG. 4 is a simplified schematic diagram of a corona discharge density of interface traps measurement apparatus.

FIG. 4 is a simplified schematic diagram of a corona discharge density of interface traps measurement apparatus. In FIG. 4, a DIT measurement tool 170 includes a vacuum chuck 175 (for holding substrate 100) mounted on an X-Y stage 180. DIT measurement tool 170 further includes a corona discharge voltage controller 185 coupled between a corona discharge electrode assembly 190, held in proximity to top surface 110A of substrate 100, and vacuum chuck 175. DIT measurement tool 170 still further includes a Kelvin probe control and measurement circuit 190 coupled between a first vibrating Kelvin probe assembly 195 (which includes a light source 200), held in proximity to top surface 110A of substrate 100, and a second vibrating Kelvin probe assembly 205 located in vacuum chuck 175. Optional chamber 210 for containing water vapor and $CO_2$ gas may also be included in DIT measurement tool 170, however generally there is sufficient water vapor and $CO_2$ in room air so chamber 210 is not required. Sufficient water vapor and $CO_2$ is greater than about 0.03 mole percent CO2 in the air and greater than about 50% percent humidity. For an SOI substrate, means of electrically connecting the frontside of the substrate to the backside of the substrate must be provided by DIT tool 170 or provided internal to the substrate.

The operation of DIT measurement tool 170 has been briefly described supra. However, more detailed descriptions of corona discharge DIT measurement tools may be found in U.S. Pat. No. 5,216,362 to Verkuil and U.S. Pat. No. 6,037,797 to Lagowski et al. both of which are hereby incorporated by reference in their entirety.

Figure 5:
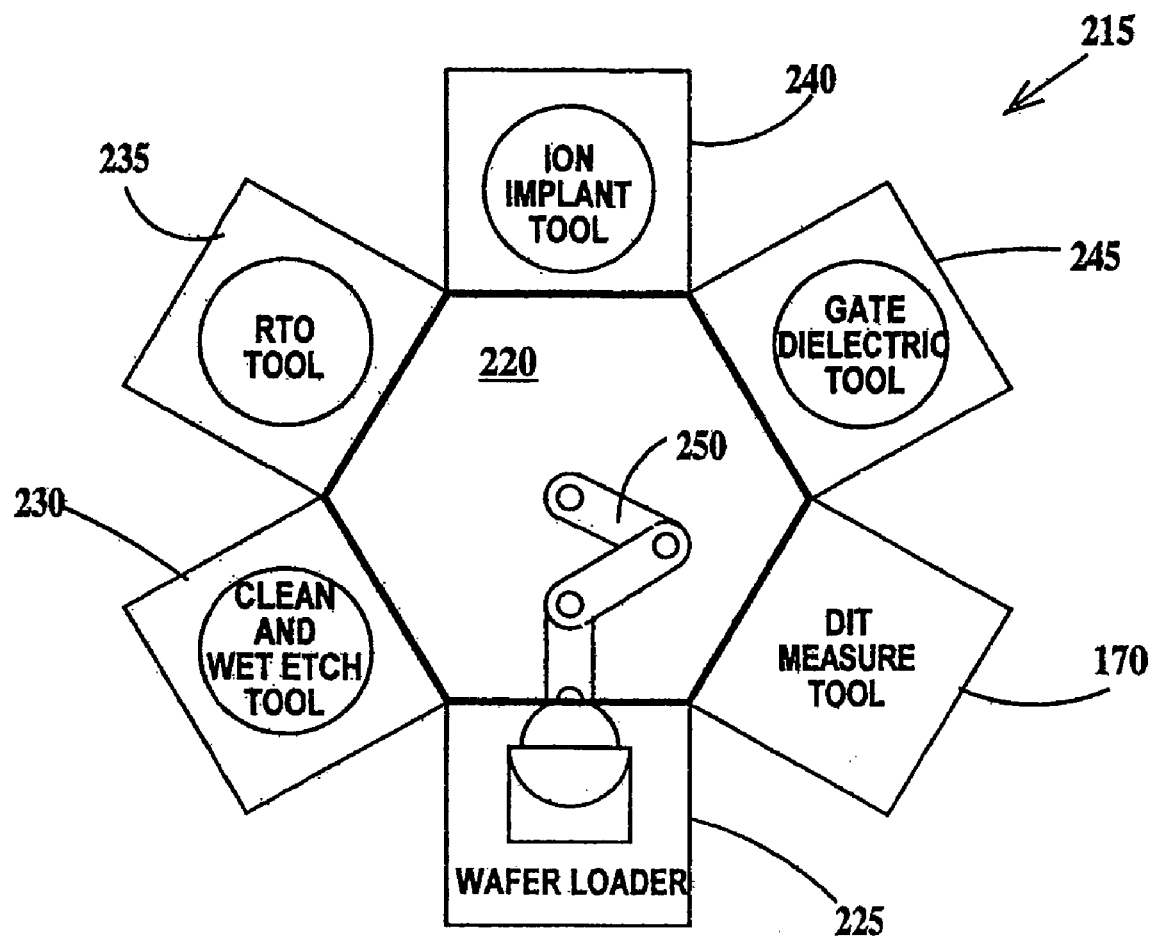
FIG. 5 is a schematic diagram of a system for practicing the present invention.

FIG. 5 is a schematic diagram of a system for practicing the present invention. In FIG. 5 a cluster tool 215 includes a hub 220 attached to which are a wafer load/unload station 225, a clean and wet etch tool 2305, a RTO tool 235 having a chamber for forming a first dielectric layer, an ion implantation tool 240, a gate dielectric tool 245 having a chamber for forming a second dielectric layer and DIT measurement tool 170 are attached. A wafer handing mechanism 250 in hub 220 can move a wafer between any of wafer load/unload station 225, clean and wet etch tool 230, RTO tool 235, ion implantation tool 240, gate dielectric tool 245 and DIT measurement tool 170.

In one example, clean and wet etch tool 230 may be a spin etch/clean tool. Clean and wet etch tool 230 may be two separate tools. In one example, gate dielectric tool 245 may be an oxidation furnace. A $RTNH_3$, RTNO, $RTNO_2$ or N* plasma tool may be substituted for ion implant tool 240.

Thus, the present invention provides an accurate, real time process control that allows corrective action to be taken in order to maximize the amount of product that is processed within specification.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, Note, the interfacial species need not be nitrogen but could be oxygen, germanium or carbon introduced by, for example ion implantation of $Ge^+$, $O_2^+$ and $C^+$ respectively. A common property of these species is they are not electrically active like dopant species (i.e. boron, phosphorus and arsenic). The present invention is applicable to monitoring any non-electrically active dielectric/silicon interface. Therefore, it is intended that the following claims cover all such modifications and changes as fall within the true spirit and scope of the invention.

The invention claimed is:

1. A system for monitoring a process that introduces interfacial species between a dielectric layer and a semiconductor substrate comprising:
   a first station for forming said dielectric layer on a top surface of said substrate;
   a second station introducing a quantity of interfacial species into said substrate; and
   a third station for measuring the density of interface traps between said substrate and said dielectric layer by corona discharge and for determining the quantity of said interfacial species introduced based on a predetermined relationship between said quantity of said interfacial species and said density of interface traps.

2. The system of claim 1 further including:
   a fourth station for removing said dielectric layer; and
   a fifth station for forming another dielectric layer on said top surface of said substrate.

3. The system of claim 1, wherein said second station includes an ion implantation tool.

4. The system of claim 1, wherein said second station includes a rapid thermal ammonia tool, a rapid thermal nitric oxide tool, a rapid thermal nitrous oxide tool or a nitrogen plasma tool.

5. The system of claim 1, wherein said interfacial species is nitrogen.

6. The system of claim 1, wherein said interfacial species is selected from the group consisting of nitrogen, oxygen, carbon and germanium.

7. The system of claim 1, wherein said relationship is in the form of a graph, an equation or a table.

8. The system of claim 1, wherein said relationship is linear within at least a range of quantity of said interfacial species introduceable by said second station.

9. The system of claim 1, wherein said semiconductor substrate is a bulk silicon substrate.

10. The system of claim 1, wherein said semiconductor substrate is a silicon-on-insulator substrate.

11. The system of claim 1, wherein said dielectric layer includes silicon oxide.

12. The system of claim 1, wherein said dielectric layer is selected from the group consisting of a high dielectric constant dielectric material, $Al_2O_3$ and $HfO_2$.

13. The system of claim 1, further including:
   means for transferring said substrate between said stations.

14. The system of claim 1, wherein said corona discharge is performed in the presence of $H_2O$, $CO_2$ or a both $H_2O$ and $CO_2$.

* * * * *